US006904581B1

(12) United States Patent
Oh (10) Patent No.: US 6,904,581 B1
(45) Date of Patent: Jun. 7, 2005

(54) SYSTEM AND METHOD FOR PLACEMENT OF DUMMY METAL FILLS WHILE PRESERVING DEVICE MATCHING AND/OR LIMITING CAPACITANCE INCREASE

(75) Inventor: Soo-Young Oh, Fremont, CA (US)

(73) Assignee: Ubitech, Inc., San Jose, CA (US)

( * ) Notice: Subject to any disclaimer, the term of this patent is extended or adjusted under 35 U.S.C. 154(b) by 51 days.

(21) Appl. No.: 10/158,617

(22) Filed: May 30, 2002

Related U.S. Application Data (63) Continuation-in-part of application No. 10/097,978, filed on Mar. 12, 2002.

(51) Int. Cl.[7] .............................................. G06F 17/50
(52) U.S. Cl. ................................ 716/10; 716/2; 716/5; 716/11
(58) Field of Search ......................... 716/1–22; 257/758

(56) References Cited

U.S. PATENT DOCUMENTS

| | | | | | |
|---|---|---|---|---|---|
| 5,763,955 | A | * | 6/1998 | Findley et al. | 257/775 |
| 5,790,417 | A | * | 8/1998 | Chao et al. | 716/21 |
| 6,323,113 | B1 | * | 11/2001 | Gabriel et al. | 438/584 |
| 6,522,007 | B2 | * | 2/2003 | Kouno et al. | 257/758 |
| 6,567,964 | B2 | * | 5/2003 | Shin et al. | 716/8 |
| 2003/0107134 | A1 | * | 6/2003 | Lee | 257/758 |

OTHER PUBLICATIONS

Zeng et al., "Parasitic and Mismatch Modeling For Optimal Stack Generation", IEEE, May 2000, pp. 193–196.*

Chen et al., "Hierarchical Dummy Fill for Process Uniformity," IEEE, Jan. 30–Feb. 2, 2001, pp. 139–144.*

Kim et al., "Champs (Chemical–Mechanical Planarization Simulator)," IEEE, Sep. 6–8, 2000, pp. 123–126.*

Tian et al., "Proximity Dummy Feature Placement and Selective Via Sizing for Process Uniformity in a Trench–First–Via–Last Dual–Inlaid Metal Process," IEEE, Jun. 4–6, 2001, pp. 48–50.*

Tian et al., "Dummy–Feature Placement for Chemical–Mechanical Polishing Uniformity in a Shallow–Trench Isolation Process," IEEE, Jan. 2002, pp. 63–71.*

Kahng et al, "Filling Algorithms and Analyses for Layout Density Control", IEEE Transactions on Computer Aided Design of Integrated Circuits and Systems, Apr. 1999, pp. 445–462, vol. 18, No. 4, IEEE Inc., New York, NY, USA.

(Continued)

*Primary Examiner*—Vuthe Siek
(74) *Attorney, Agent, or Firm*—Jung-hua Kuo (57) ABSTRACT

Systems and methods for placement of dummy metal fills while preventing disturbance of device matching and optionally limiting capacitance increase are disclosed. A computer-automated method for locating dummy fills in an integrated circuit fabrication process generally comprises receiving an input layout of the integrated circuit and specification of device matching for the integrated circuit and locating the dummy fills in the integrated circuit according to dummy rules while preserving device matching. Locating the dummy fills may include locating the dummy fills along the at least one axis of symmetry where device matching is along an axis of symmetry and locating the dummy fills so as to preserve matching of the repeated elements where device matching is repeated matched elements. The method may also include designating at least one net of the integrated circuit as a critical net, the critical nets being only a subset of all nets of the integrated circuit, identifying metal conductors corresponding to each designated critical net from the layout file, and delineating a net blocking exclusion zone extending a distance of a minimum net blocking distance (NBD) from the metal conductor for each metal conductor identified, wherein the step of locating locates the dummy fills outside of the net blocking exclusion zone.

41 Claims, 5 Drawing Sheets

OTHER PUBLICATIONS

Wong et al, "A Technology–Independent Methodology of Placement Generation for Analog Circuit", Proceedings of the ASP–DAC, Jan. 1999, pp. 141–144, IEEE, Piscataway, NJ, USA.

Balasa et al, "Module Placement for Analog Layout Using the Sequence–Pair Representation", Proceedings of the 36th Design Automation Conference, Jun. 1999, pp. 274–279, IEEE, Piscataway, NJ, USA.

Stine et al, "The Physical and Electrical Effects of Metal–Fill Patterning Practices for Oxide Chemical–Mechanical Polishing Processes", IEEE Transactions on Electron Devices, Mar. 1998, pp. 664–679, vol. 45, No. 3, IEEE Inc. New York, NY, USA.

Park et al., "An Exhaustive Method for Characterizing the Interconnect Capacitance Considering the Floating Dummy–Fills by Employing an Efficient Field Solving Algorithm", Simulation of Semiconductor Processes and Devices, Sep. 7, 2000 (SISPAD 2000), p. 98–101.

Ouma et al., "An Integrated Characterization and Modeling Methodology for CMP Dielectric Planarization", Proc. of Interconnect Technology Conference, Feb. 1998, pp. 67–69.

Lee et al., "Analyzing the Effects of Floating Dummy–Fills: From Feature Scale Analysis to Full–Chip RC Extraction," Proc. of IEDM 2001, Dec. 2001.

Tian et al., "Model–Based Dummy Feature Placement for Oxide Chemical–Mechanical Polishing Manufacturability", IEEE Transactions on Computer–Aided Design of Integrated Circuits and Systems, vol. 20, No. 7, Jul. 2001, pp. 902–910.

* cited by examiner

SYSTEM AND METHOD FOR PLACEMENT OF DUMMY METAL FILLS WHILE PRESERVING DEVICE MATCHING AND/OR LIMITING CAPACITANCE INCREASE

CROSS REFERENCE TO RELATED APPLICATIONS

This application is a continuation-in-part of co-pending U.S. patent application Ser. No. 10/097,978 entitled "System And Method For Limiting Increase In Capacitance Due To Dummy Metal Fills Utilized For Improving Planar Profile Uniformity," filed on Mar. 12, 2002, the entirety of which is incorporated herein by reference.

BACKGROUND OF THE INVENTION

1. Field of the Invention

The present invention relates generally to semiconductor processing. More specifically, systems and methods for placement of dummy metal fills while preventing disturbance of device matching and optionally limiting capacitance increase are disclosed.

2. Description of Related Art

Typically, an integrated circuit fabrication process involves a series of layering processes in which metallization, dielectrics, and other materials are applied to the surface of a semiconductor wafer to form a layered interconnected structure. The integrated circuits formed from the wafer generally include interlayered circuits comprising a plurality of metal lines across multiple layers that are interconnected by metal-filled vias. Thus, one of the critical steps in the fabrication process is the formation of interconnects that connect the layers of the integrated circuit device, resulting in integrated circuit devices with high complexity and circuit density.

Particularly in the fabrication of sub-0.35 $\mu$m semiconductor devices, it is important that the fabrication process produces good planarization with each layer of the integrated circuit prior to subsequent layering steps in order to reduce process yield loss from those subsequent layering steps. A planarized surface is often necessary to maintain a required level of photolithographic depth of focus for subsequent steps and to ensure that metal interconnects are not deformed over contour steps.

For example, a damascene method is often employed for metallization of the interconnects between layers. The damascene method involves etching a via or trench pattern into a planar dielectric layer down to the active region of the device. Excess metal is typically deposited over the entire wafer surface in order to fill the vias or trenches. The excess portions of the metal layer are then polished and removed down to the patterned metal surface, leaving the thin lines of metals as interconnects. As with other steps in the fabrication process, it is important that the polished interconnect damascene layer be planar.

In order to achieve the degree of planarity required to produce ultra high density integrated circuits, chemical-mechanical polishing or planarization (CMP) process is employed to planarize the topography of films or layers on the substrate. In general, the CMP process is an abrasive process that involves selective removal of material from the semiconductor wafer by rotating a polishing pad and the wafer relative to each other while applying a controlled amount of pressure in the presence of a chemical slurry. CMP can be performed on both oxides and metals and can produce good local planarization. After the CMP process, the smoothed surface is ready for subsequent process steps, such as adding more layers.

However, the planar profile resulting from the CMP process is often dependent on the pattern density of the underlying layer and can thus vary by more than 30–40%. This underlying pattern dependency is discussed, for example, in "An Integrated Characterization and Modeling Methodology for CMP Dielectric Planarization," Ouma et al., Proc. of Interconnect Technology Conference, February 1998, pp. 67–69, the entirety of which is incorporated by reference herein.

One method of reducing CMP planar profile variation resulting from pattern dependency is with the use of dummy metal fills. In particular, dummy metal fills or features are inserted onto the wafer prior to the CMP process so as to make the pattern density more uniform in IC chips, i.e., to help level the feature density across the layout. Uniform feature density improves wafer-processing uniformity for certain operations such as CMP. Thus, dummy metal fills facilitate in reducing the pattern-dependent profile variation after CMP.

Placement of the dummy fills are typically made according to conventional dummy fill rules that locate the uniform-density dummies where space is available (rule-based dummy fill). See, for example, "Analyzing the Effects of Floating Dummy-Fills: From Feature Scale Analysis to Full-Chip RC Extraction," Lee et al., Proc. of IEDM 2001, December 2001, the entirety of which is incorporated by reference herein. However, one problem with the rule-based dummy fill is that the range of allowable dummy-filled density is relatively large such that the prescribed density is generally determined through trial-and-error for each design.

Model-based dummy filling can also be utilized to reduce CMP planar profile variation resulting from pattern dependency. Because the CMP planar profile is generally proportional to the effective pattern density as a result of an averaging effect caused by the rotation of the polishing pad, model-based dummy filling can reduce the large planar profile variation by selectively inserting dummy fills to achieve an effective density to within a predetermined range. See, for example, "Model-Based Dummy Feature Placement for Oxide Chemical-Mechanical Polishing Manufacturability," Tian et al., IEEE Transactions on Computer-Aided Design of Integrated Circuits and Systems, Vol. 20, No. 7, July 2001, pp. 902–910, the entirety of which is incorporated by reference herein.

However, the inserted dummy metal fills adversely affect the electrical field and increase the capacitance of the original metal lines. The increase in the net capacitances can be more than 25% in certain long critical nets. Some nets span across the entire chip making their effect on the performance of the chip critical. Common critical nets are global control signals such as clocks. Generally, the total delay for long interconnect nets is dominated by the interconnect RC delay such that increase in the total net delay is directly proportional to increase in the net capacitance. Thus, a 25% net delay increase can be sufficient to cause a fault condition for the circuit functionality.

As noted in Tian, referenced above, the capacitance decreases rapidly with the distance between the dummy metals and original metal lines. In order to reduce the capacitance increase, Tian proposed a model-based dummy metal fill that maximizes the distance between original metal lines and dummy metals within a cell within available area constraints. The method proposed by Tian attempts to reduce the capacitance increase for all nets. However, it is difficult to reduce the capacitance increase for all nets and the method proposed by Tian can not guarantee a reduction of the capacitance increase to within a specified range for the long timing-critical nets.

The inserted dummy metal fills may also adversely affect other characteristics of the original circuit or device design. Thus, what is needed are systems and methods for improving the uniformity of planar profile after CMP while maintaining or preserving circuit or device characteristics.

SUMMARY OF THE INVENTION

Systems and methods for placement of dummy metal fills while preventing disturbance of device matching and optionally limiting capacitance increase are disclosed. The systems and methods take into account the influence of dummy fill metals that are transferred to structures printed on the wafer to thereby limit disturbance of device matching and optionally to limit capacitance increase. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

A computer-automated method for locating dummy fills in an integrated circuit fabrication process generally comprises receiving as input layout of the integrated circuit and specification of device matching for the integrated circuit and locating the dummy fills in the integrated circuit according to dummy rules while preserving device matching. For example, the integrated circuit may have device matching by having at least one axis of symmetry along which the integrated circuit has device matching symmetry. As another example, integrated circuit may have device matching by having repeating matched elements such as in a row, a column, or an array. Thus, locating the dummy fills may include locating the dummy fills along the at least one axis of symmetry where device matching is along an axis of symmetry and locating the dummy fills so as to preserve matching of the repeated elements where device matching is repeated matched elements.

To also limit capacitance increase due to the dummy fills, the method may optionally further comprise designating at least one net of the integrated circuit as a critical net, the critical nets being only a subset of all nets of the integrated circuit, identifying metal conductors corresponding to each designated critical net from the layout file, and delineating a net blocking exclusion zone extending a distance of a minimum net blocking distance (NBD) from the metal conductor for each metal conductor identified. The step of locating the dummy fills would includes locating the dummy fills outside of the net blocking exclusion zone.

The critical nets may be received as input from a user or from output of a CAD tool. The method may further comprise setting the minimum NBD. Alternatively, the method may further comprise setting a maximum allowable capacitance increase, preferably to a level that ensures circuit functionality, and determining the minimum NBD that limits the maximum capacitance increase to the maximum allowable capacitance increase. The minimum NBD may be determined utilizing capacitance simulation software such as PASCAL™ and/or RAPHAEL™ and is preferably performed by evaluating only the designated critical net(s).

Typically, metal conductors corresponding to the at least one designated critical net are identified using, for example, net tracing such as where the layout file is in GDS-II format and/or tagging using the layout file such as where the layout file contains net connectivity information. Typically a layout file that contains net connectivity information is either in annotated GDS-II format or LEF/DEF (library exchange format/design exchange format). Generally, the net blocking exclusion zone includes at least a blocked zone in a designated signal net layer containing the corresponding metal conductor and in any other layers that are within a distance of the minimum NBD from the corresponding metal conductor. Further, the locating of the dummy fills may comprise utilizing a model-based and/or a rule-based dummy filling process.

A system for locating dummy fills in an integrated circuit fabrication process generally comprises an input for receiving data that includes layout of the integrated circuit and specification of device matching of the integrated circuit and a dummy fill locator that locates the dummy fills according to dummy rules while preserving device matching.

To also limit capacitance increase due to the dummy fills, the input may also receive data that designates only a subset of all nets of the integrated circuit as the designated critical net(s), a metal conductor identification processor for identifying metal conductors corresponding to each designated critical net from the layout file, and an exclusion zone processor for delineating a net blocking exclusion zone extending a distance of a minimum NBD from the metal conductor for each metal conductor identified. The dummy fill locator would locate the dummy fills outside of the net blocking exclusion zone according to, for example, dummy rules provided by users, while preserving device matching such as preserving device symmetry along the axis of symmetry or preserving matched elements.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF SPECIFIC EMBODIMENTS

Systems and methods for placement of dummy metal fills while preventing disturbance of device matching and optionally limiting capacitance increase are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
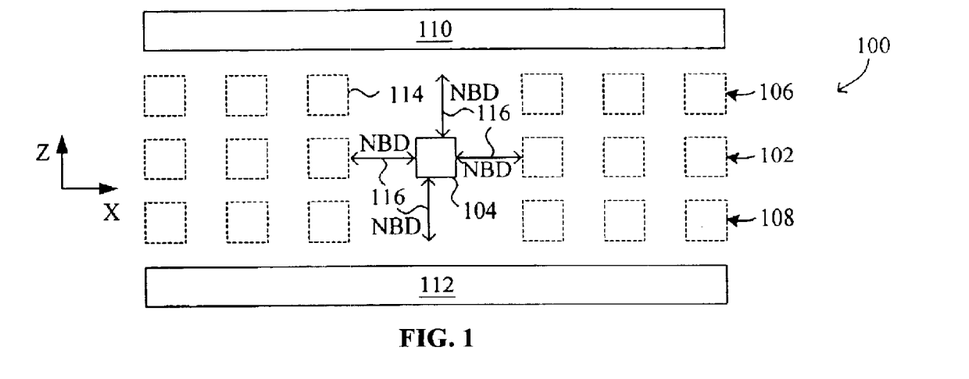
FIG. 1 is a partial cross-sectional view of an exemplary circuit having multiple metal layers.
Figure 2:
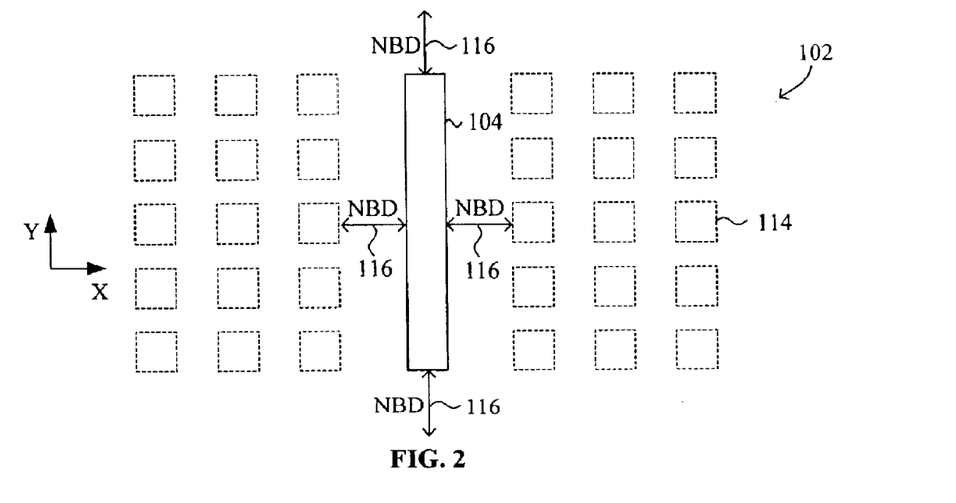
FIG. 2 is a partial plan view of a metal layer of the circuit of FIG. 1 containing a designated signal net.
Figure 3:
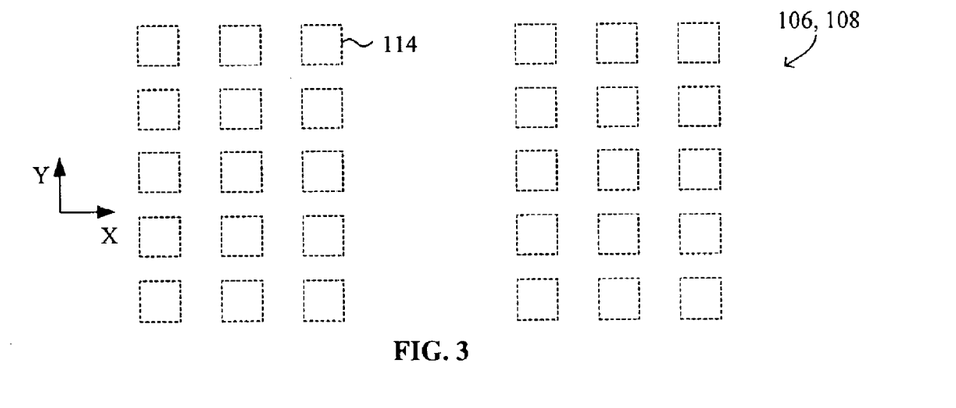
FIG. 3 is a partial plan view of a metal layer of the circuit of FIG. 1 above and below the layer containing a designated signal net.

FIG. 1 is a partial cross-sectional view of an integrated circuit (IC) chip 100 having multiple metal layers 102 and 106–112. It is noted that layer 112 is typically a substrate. FIG. 2 is a partial plan view of the designated signal net layer 102 containing a designated signal net 104 and FIG. 3 is a partial plan view of a metal layer 106, 108 above and below the designated signal net layer 102 containing the designated signal net 104.

A designated critical signal net as represented by a fixed-bias original metal 104 is located in designated signal net layer 102. Upper and lower metal layers 106, 108 are layers above and below the designated signal net layer 102, respectively. In addition, ground layers 110, 112 are upper and lower ground planes, respectively. Floating dummy metal fills 114 are located in the designated signal net layer 102 as well as the upper and lower metal layers 106, 108.

In an IC chip such as the IC chip 100 partially shown in FIG. 1, the total delay of a net generally comprises transistor delay and interconnect RC delay. For a short net, the total delay mostly comprises of the transistor delay while the increase in the interconnect RC delay is mostly negligible. In contrast, for a long net, the total delay mostly comprises the interconnect RC delay while the transistor delay is mostly negligible. Accordingly, the increase of capacitance by dummy metal fills 114 is typically only of importance for long timing-critical nets. Thus, limiting the capacitance increase to within a specified range only for long timing-critical nets is generally sufficient to ensure circuit functionality.

For a given IC chip, any suitable number of long timing-critical nets may be selected and designated as designated critical signal nets. The increase in capacitance resulting from dummy metal fills for the designated critical signal nets may optionally be limited to within a specified range to ensure circuit functionality in accordance with a process as described below in more detail below. Additionally or alternatively, dummy metal fills preferably preserves device matching in the circuit as will also be described in more detail below with reference to FIGS. 4–6.

To limit the increase in capacitance resulting from dummy metal fills to within a specified range, it is noted that as the distance between the dummy metal fills and the original metal line increases, the increase in capacitance introduced by the dummy metal fills rapidly decreases. However, dummy metal removal is very time-consuming and practically impossible to do manually in the multi-million transistor IC chips even if dummy metal removal is conducted for only the critical nets.

Thus, as shown in FIG. 1, the floating dummy metal fills 114 are blocked or excluded from being within a minimum or net blocking or buffer distance (NBD) 116 from the fixed-bias original metal 104 of the designated signal net. By maintaining a minimum distance of NBD between the original metal 104 and the floating dummy metal fills 114, the capacitance increase in the critical net due to the dummy fills can be limited.

As shown in FIGS. 1–3, the dummy metal fills 114 are blocked from being within a distance of NBD from the designated signal net 104 in the X, Y, and Z directions. In particular, the dummy metal fills 114 are blocked from being within a distance of NBD from the designated signal net 104 in the X direction in the designated signal net layer 102. It is to be understood that if the designated signal net 104 does not extend the length of the designated signal net layer 102 in the Y direction, then the dummy metals fills 114 would also be blocked from being within a distance of NBD from the designated signal net 104 in the Y direction in the designated signal net layer 102. In addition, the dummy metal fills 114 are also blocked from being within a distance of NBD from the designated signal net 104 in the Z direction, i.e., perpendicular to the layers 102, 106, 108, as shown in FIG. 1.

In the particular example shown, only the upper and lower metal layers 106, 108 are within a distance of NBD 104 in the Z direction from the designated signal net. Thus each upper and lower metal layer 106, 108 has an NBD exclusion zone similar to that of the designated signal net layer 102, as shown in the partial plan view of FIG. 3. Although not shown, it is to be understood that, dummy metal fills 114 may be blocked from being within a distance of NBD from the designated signal net 104 in zero or more layers above and below the designated signal net layer 102. For example, where the NBD is sufficiently small, the dummy metal fills are only blocked from being within a distance of NBD from the designated signal net 104 in the designated signal net layer 102 and no other layers. As another example, where the NBD is larger, the dummy metal fills are blocked from being within a distance of NBD from the designated signal net 104 not only in the designated signal net layer 102 but also in additional layers above and/or below the designated signal net layer 102. Generally, the number of layers to which the dummy metal fill blocking applies is the same for those above and those below the designated signal net layer 102.

An NBD exclusion zone is generally defined as an area covering a minimum distance of NBD from the designated signal net 104. The NBD exclusion zone may be defined, for example, by delineating an imaginary sphere-like shape omnidirectionally around the designated signal net 104. In an alternative embodiment, the NBD exclusion zone may be defined by delineating an imaginary shape that extends out a distance of NBD in each of the X, Y, and Z directions from the designated signal net 104. Typically, the designated signal net 104 is generally a rectangular prism, i.e., rectangular polyhedron, with six sides such that the NBD exclusion zone is also a rectangular prism. It is to be understood that any other suitable delineation of the NBD exclusion zone may be implemented.

The NBD is preferably determined in such a way so as to limit the capacitance increase to below a predetermined amount in order to ensure circuit functionality. Preferably, a computer-automated process is utilized to determine locations of the dummy metals so as to exclude the dummy metals from within a distance of NBD from the critical nets. The computer-automated process will be described below with reference to FIG. 7.

As is known in the art, characteristics of device matching include, for example, noise cancellation. Thus, locating the floating dummy metal fills while preserving device matching facilitates in preserving the characteristics of device symmetry. Device matching may be provided by providing device symmetry along at least one axis of symmetry and/or by providing repeating matched elements. Device matching may also be provided in a row, a column, or in an array. Device matching provided by providing device symmetry along at least one axis of symmetry is described below with reference to FIGS. 4 and 5 while device matching provided by providing repeating matched elements is described below with reference to FIG. 6.

Figure 4:
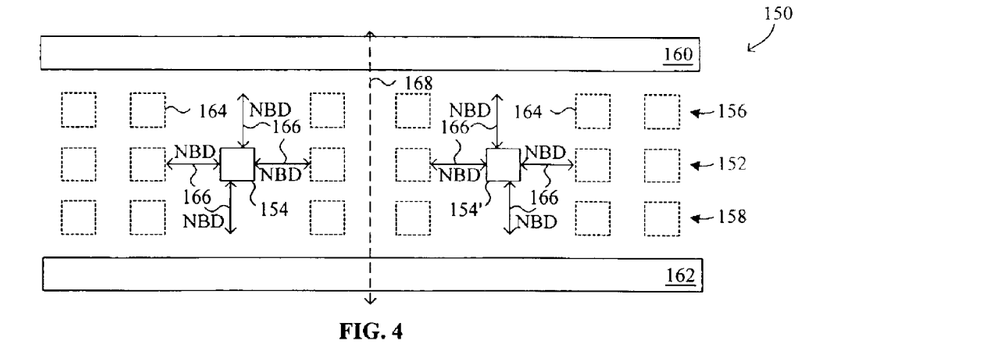
FIG. 4 is a partial cross-sectional view of another exemplary circuit having multiple metal layers with device matching by providing device symmetry along an axis of symmetry.
Figure 5:
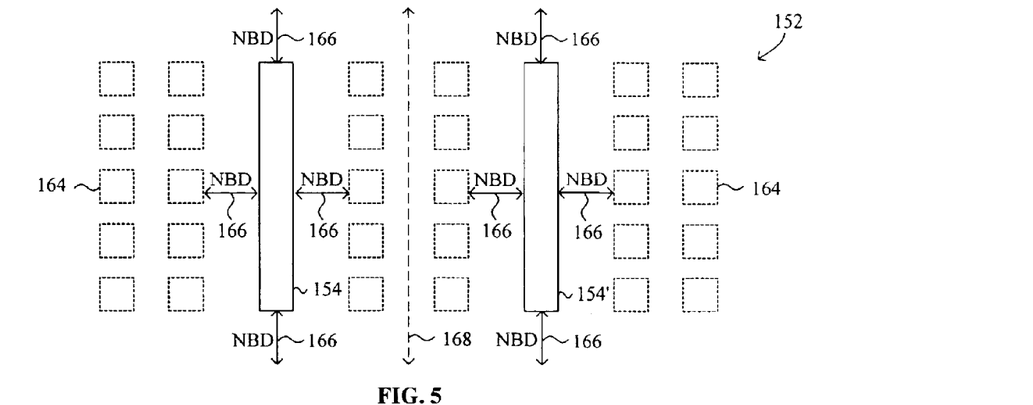
FIG. 5 is a partial plan view of a metal layer of the circuit of FIG. 4 containing a designated signal net.

FIG. 4 is a partial cross-sectional view of another exemplary IC chip 150 having multiple metal layers 152 and 156–162 and device matching by providing device symmetry along the axis of symmetry 168. FIG. 5 is a partial plan view of the layer 152 that is a designated signal net containing designated signal nets 154 and 154' which are symmetric along the axis of symmetry 168. As is evident, the integrated circuit chip 150 may have device matching by having at least one axis of symmetry 168 along which the integrated circuit has device matching.

As shown in FIG. 4, layer 162 is typically a substrate. Although only two elements of an IC chip are shown to be matched along a single axis of symmetry, it is noted that a chip with device matching may typically include any suitable number of symmetrically matched elements such as in a row, a column, or in an array. IC chip 150 with symmetric device matching along an axis of symmetry is similar to the IC chip shown and described above with reference to FIGS. 1–3 and as such, similar elements and concepts will not be described again in detail for purposes of clarity.

Signal nets as represented by fixed-bias original metals 154, 154' may be designated as critical signal nets and the signal net layer containing the designated critical signal nets may be designated as a designated signal net layer 152. Upper and lower metal layers 156, 158 are layers above and below the designated signal net layer 152, respectively. In addition, ground layers 160, 162 are upper and lower ground planes, respectively.

Floating dummy metal fills 164 may be located in the designated signal net layer 152 as well as the upper and lower metal layers 156, 158 such that device symmetry along the axis of symmetry 168 is preserved. As discussed above, the floating dummy metal fills 164 may optionally be blocked or excluded from being within a minimum or net blocking or buffer distance (NBD) 166 from the fixed-bias original metals 154, 154' of the designated signal net. In addition, as shown in FIGS. 4 and 5, the floating dummy metal fills 164 are located symmetrically along the axis of symmetry in each of the layers 152, 156, 158.

Figure 6:
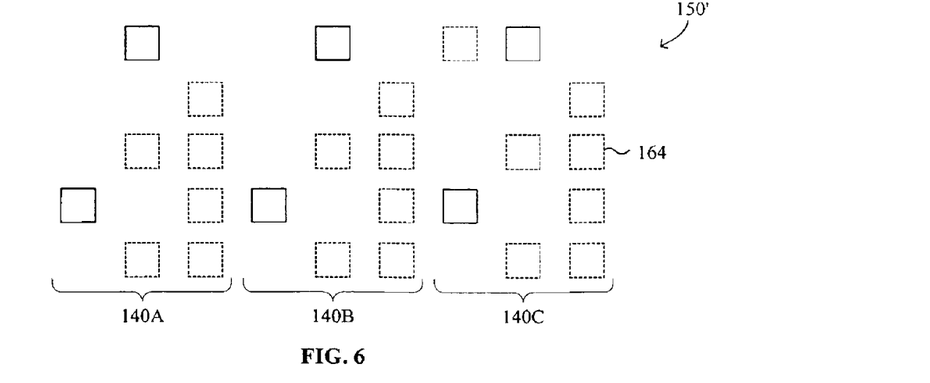
FIG. 6 illustrates yet another exemplary circuit having device matching by providing repeating matched elements.

FIG. 6 illustrates another exemplary IC chip 150' with device matching by providing repeated matched elements 140A, 140B, 140C. The repeating matched elements 140A, 140B, 140C may be in a row as shown or in a column or in an array. The floating dummy metal fills 164 are located in each of the matched elements 140A, 140B, 140C so as to preserve the matching of the repeated elements. In other words, the floating dummy metal fills 164 are located in the matched elements 140A, 140B, 140C such that each of the matched elements has the same number and placement of the floating dummy metal fills 164, thus preserving the matching among the repeating elements.

Preferably, for a given IC chip with device matching, the axes of symmetry and/or the repeating matched elements are specified so as to facilitate dummy placement while preserving device matching. A computer-automated process is utilized to determine locations of the dummy metals so as to optionally exclude the dummy metals from within a distance of NBD from the critical nets while preserving device matching such as by preserving symmetry along the specified axes of symmetry or while preserving the matching among the repeating elements. The computer-automated process is described below with reference to FIG. 7.

Figure 7:
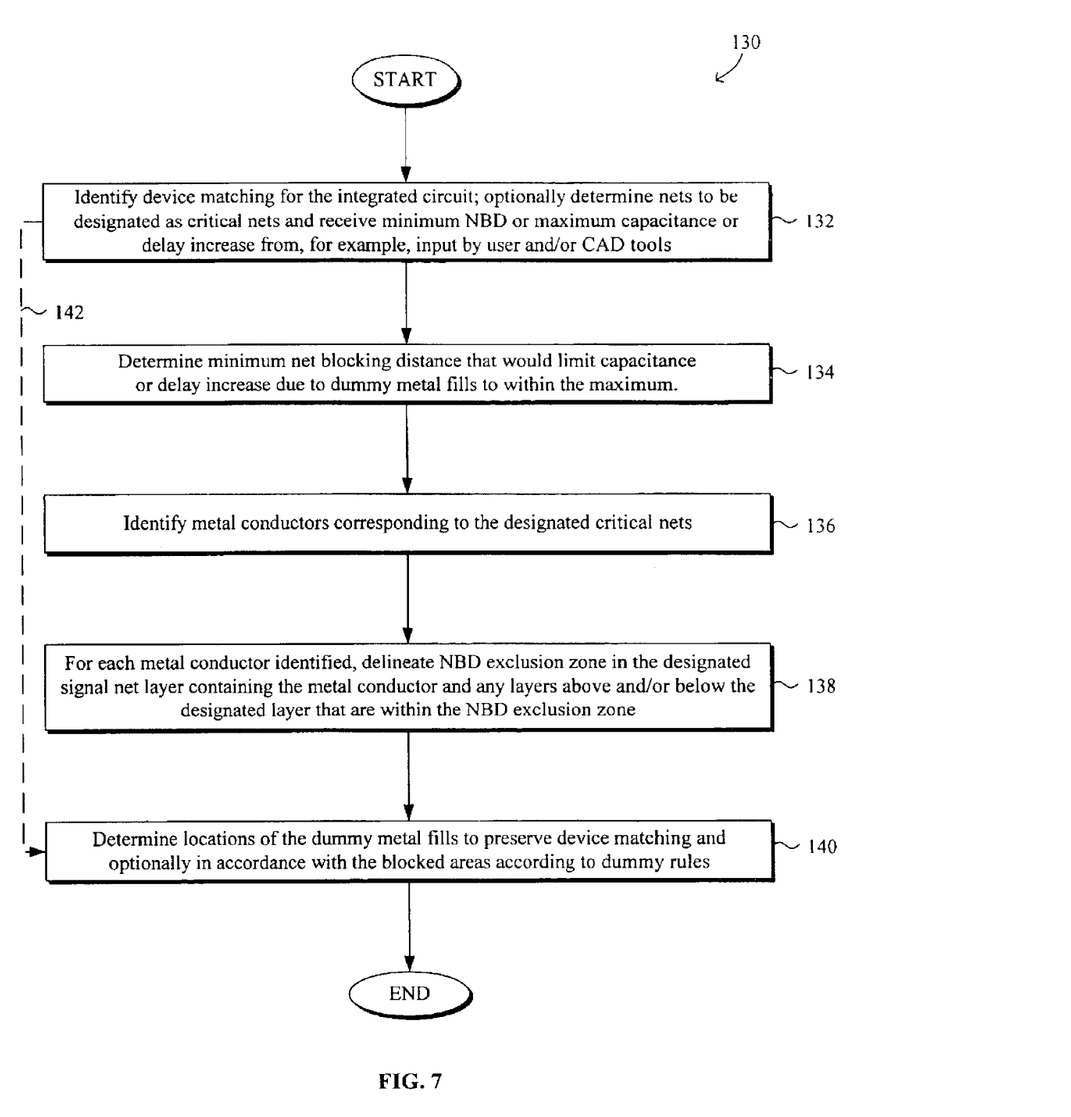
FIG. 7 is a flow chart illustrating a computer-automated process that determines placement of dummy metal fills to facilitate in preserving device matching and/or limiting capacitance increase due to dummy metal fills.

FIG. 7 is a flow chart illustrating a computer-automated process 130 that determines placement of dummy metal fills to facilitate in preserving device matching and/or limiting capacitance increase due to dummy metal fills. It is noted that the process may be implemented with the device matching feature alone, with the capacitance increase limiting feature alone, or a combination of both features. As discussed above, dummy metal fills are utilized to improve planar profile uniformity by helping to level the feature density across a layout. The computer-automated process 130 locates the dummy metal fills so as to preserve device matching and/or limit capacitance increase due to the dummy metal fills to within a specified range for long timing-critical nets in order to ensure circuit functionality. In particular, process 130 facilitates in preserving device matching and/or in blocking or excluding dummy metal fills from within a safe buffer distance from the critical nets.

At step 132, device matching for the integrated circuit is identified. As discussed above, device matching may be provided by having at least one axis of symmetry along which the integrated circuit has symmetrically matched elements and/or by having matched repeating elements such as in a row, column, or array.

If the process 130 does not facilitate in blocking or excluding dummy metal fills from within a buffer distance from the critical nets in order to limit capacitance increase, then the process proceeds to, as shown by dashed arrow 142, step 140 as will be described below.

Alternatively, if the process 130 also facilitates in blocking or excluding dummy metal fills from within a buffer distance from the critical nets in order to limit capacitance increase, nets to be designated as critical nets and the maximum acceptable capacitance or delay increase due to dummy metal fills may be determined from, for example, input by user and/or CAD tools in step 132.

Next, at step 134, the computer-automated process determines the minimum safe or buffer distance NBD that would limit the capacitance or delay increase due to dummy metal fills to within the maximum determined in step 132. Typically, this step is performed independent of the designated critical nets. Thus, as is evident, step 134 may be performed before, simultaneously with, or after step 132. Any suitable simulation software including a commercial off-the-shelf (COTS) capacitance simulation software such as PASCAL™, a 3D capacitance simulator promulgated by Samsung Electronics Co., Ltd. of Seoul, Korea, may be utilized to determine the minimum safe distance. See, for example, Jin-Kyu Park et al., "An Exhaustive Method for Characterizing the Interconnect Capacitance Considering the Floating Dummy-Fills by Employing an Efficient Field Solving Algorithm," Simulation of Semiconductor Processes and Devices (SISPAD 2000), pg. 98–101, Sep. 7, 2000, the entirety of which is incorporated by reference herein. Any other suitable 3D capacitance simulator, such as RAPHAEL™, an interconnect analysis software product promulgated by AVANT! Corporation of Fremont, Calif., may alternatively be utilized.

At step 136, the computer-automated process identifies metal conductors corresponding to the critical nets designated in step 132. This may be achieved, for example, using net tracing using an input layout file for the integrate circuit, such as a layout file in GDS-II format. Alternatively, step 136 may be performed by tagging using an annotated circuit layout file such as a layout file in annotated GDS-II format.

At step 138, for each metal conductor identified in step 136, the computer-automated process delineates the NBD exclusion zone in the designated signal net layer containing the metal conductor and any layers above and below the designated signal net layer that are within the NBD exclusion zone. If any layer(s) above and/or below the designated signal net layer are within the NBD exclusion zone, a blocked area or zone in each such layer similar to that in the designated signal net layer is blocked from having any dummy metal fills located therein.

At step 140, the locations of the dummy metal fills are determined in such a way so as to preserve device matching and optionally in accordance with the blocked areas as determined in step 138. In other words, the dummy metal fill locations are symmetric along the specified axes of symmetry and/or are matched among the repeated elements and optionally are only within the permissible areas outside of the blocked areas or zones. Any suitable dummy fill method such as a rule-based or a model-based dummy filling process may be implemented in order to achieve the desired planar profile.

It is to be understood that the process 130 is not limited to the particular order of the various steps presented herein. Rather, the various steps of process 130 can be executed in any suitable order.

Figure 8:
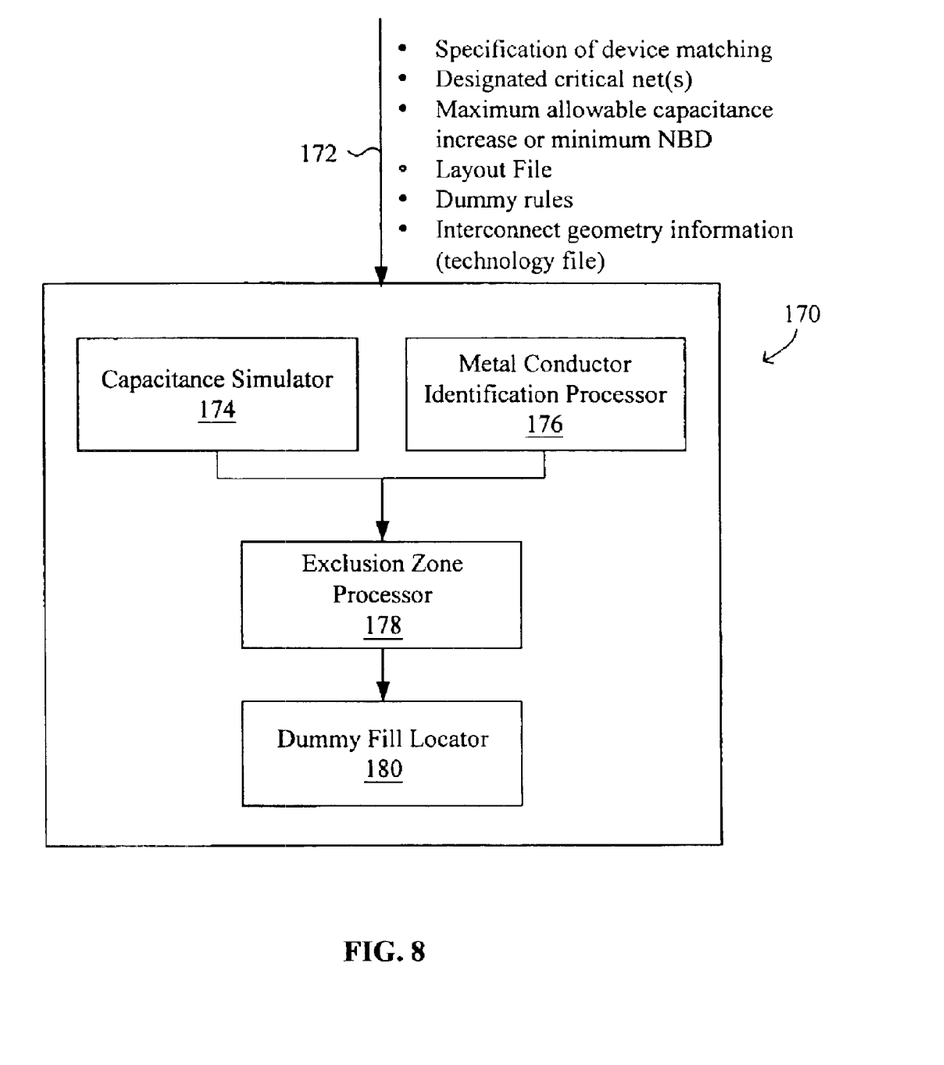
FIG. 8 is a block diagram illustrating a system that may be utilized to implement the process of FIG. 7 for locating dummy fills in an integrated circuit fabrication process.

It is noted that the systems and methods for preserving device matching and/or limiting increase in capacitance due to dummy metal fills described herein may be utilized for certain wafer-processing operations such as CMP. However, these systems and methods may generally be utilized for any suitable wafer-processing operation FIG. 8 is a block diagram illustrating a system 170 that may be utilized to implement the process of FIG. 7 to locate dummy fills in an integrated circuit fabrication process. In particular, the system 170 may include an input 172 that receives: (a) specification of device matching, namely (i) specification of axis or axes of symmetry along which the integrated circuit has symmetric device matching and/or (ii) specification of repeating matched elements, (b) input for designating at least one net of the integrated circuit as a designated critical net, (c) input for setting either a maximum allowable capacitance increase due to the dummy fills and or a minimum NBD, (d) a layout file that specifies the integrated circuit layout, (e) dummy rules, and/or (f) interconnect geometry information, often referred to as the technology file. Typically, the layout file is in GDS-II format or annotated GDS-II format, as is well known in the art. Although each of the inputs may be received via input 172, it is to be understood that the dummy rules, for example, may already be stored in the system 170. It is noted that although each input data is listed and shown as a separate inputs, any or all of the data may be received by the input 172 in any suitable number of separate inputs. For example, the layout file may also include the specification of the device matching.

It is also noted that inputs (b), (c) are typically only needed where the system 170 also facilitates in blocking or excluding dummy metal fills from within a buffer distance from the critical nets in order to limit capacitance increase. In such case, the system 170 may also include a capacitance simulator 174 for determining the minimum blocking distance. The capacitance simulator determines a minimum net blocking distance that limits the maximum capacitance increase to the set maximum capacitance. The capacitance simulator may implement any suitable capacitance simulation software such as PASCAL™ and/or RAPHAEL™, as discussed above. Where the minimum net blocking distance is provided as an input to system 170 for a given process, the capacitance simulator 174 is not needed as part of the system 170 and thus need not be utilized for the particular process.

In addition, the system 170 may further include a metal conductor identification processor 176 that identifies metal conductors corresponding to each designated critical net. Each metal conductor is located in a corresponding designated signal net layer. Thus, the system 170 may also include an exclusion zone processor 178 that sets a net blocking exclusion zone in the designated signal net layer and any other layers that are within the net blocking distance of the metal conductor.

The system 170 includes a dummy fill locator 180 that locates the dummy fills according to dummy rules. The dummy fill locator 180 locates the dummy fills while preserving device matching to thereby facilitate in preserving characteristics of device matching. For example, the dummy fill locator 180 may locate the dummy fills symmetrically along the specified axes of symmetry and/or may locate the dummy fills so as to preserve the matching among repeating elements. The dummy fill locator 180 optionally also locates dummy fills outside of the net blocking exclusion zone where the system 170 also facilitates in blocking or excluding dummy metal fills in order to limit capacitance increase.

It is noted that although each component or processor is shown and described as separate processors, any suitable number of processors may be utilized to implement the functions as described herein.

Figure 9:
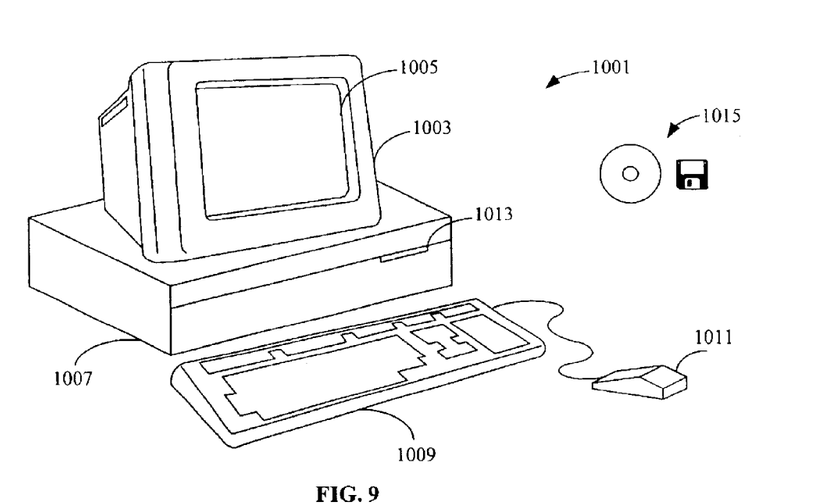
FIG. 9 illustrates an example of a computer system that can be utilized with the various embodiments of method and processing described herein.
Figure 10:
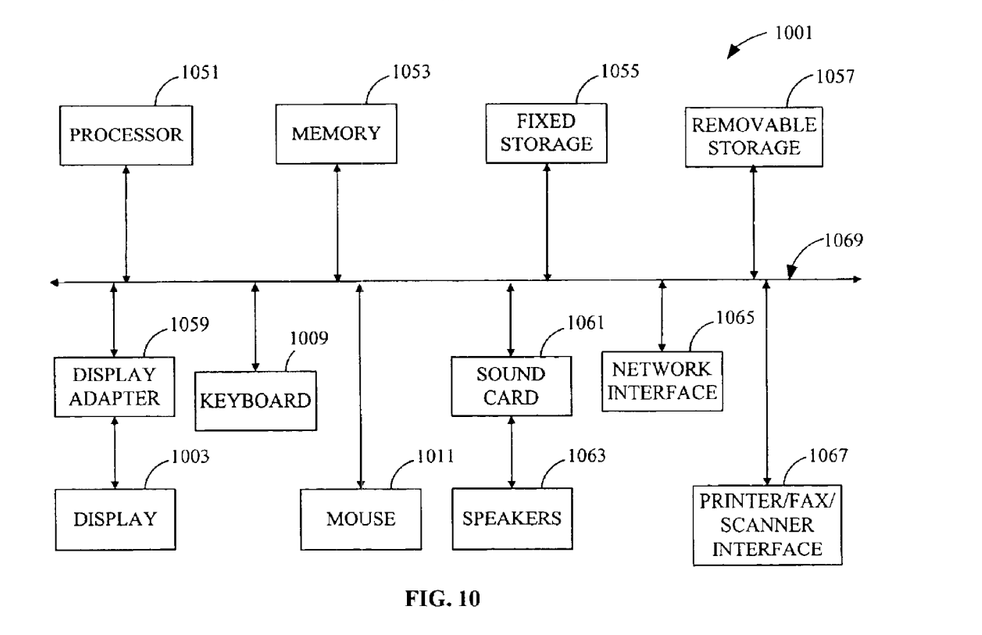
FIG. 10 illustrates a system block diagram of the computer system of FIG. 9.

FIGS. 9 and 10 illustrate a schematic and a block diagram, respectively, of an example of a general purpose computer system 1001 suitable for executing software programs that implement the methods and processes described herein. The architecture and configuration of the computer system 1001 shown and described herein are merely illustrative and other computer system architectures and configurations may also be utilized.

The exemplary computer system 1001 includes a display 1003, a screen 1005, a cabinet 1007, a keyboard 1009, and a mouse 1011. The cabinet 1007 typically houses one or more drives to read a computer readable storage medium 1015, a system memory 1053, and a hard drive 1055 which can be utilized to store and/or retrieve software programs incorporating computer codes that implement the methods and processes described herein and/or data for use with the software programs, for example. A CD and a floppy disk 1015 are shown as exemplary computer readable storage media readable by a corresponding floppy disk or CD-ROM or CD-RW drive 1013. Computer readable medium typically refers to any data storage device that can store data readable by a computer system. Examples of computer readable storage media include magnetic media such as hard disks, floppy disks, and magnetic tape, optical media such as CD-ROM disks, magneto-optical media such as floptical disks, and specially configured hardware devices such as application-specific integrated circuits (ASICs), programmable logic devices (PLDs), and ROM and RAM devices.

Further, computer readable storage medium may also encompass data signals embodied in a carrier wave such as the data signals embodied in a carrier wave carried in a network. Such a network may be an intranet within a corporate or other environment, the Internet, or any network of a plurality of coupled computes such that the computer readable code may be stored and executed in a distributed fashion.

The computer system 1001 comprises various subsystems such as a microprocessor 1051 (also referred to as a CPU or central processing unit), system memory 1053, fixed storage 1055 (such as a hard drive), removable storage 1057 (such as a CD-ROM drive), display adapter 1059, sound card 1061, transducers 1063 (such as speakers and microphones), network interface 1065, and/or printer/fax/scanner interface 1067. The computer system 1001 also includes a system bus 1069. However, the specific buses shown are merely illustrative of any interconnection scheme serving to link the various subsystems. For example, a local bus can be utilized to connect the central processor to the system memory and display adapter.

Methods and processes described herein may be executed solely upon CPU 1051 and/or may be performed across a network such as the Internet, intranet networks, or LANs (local area networks) in conjunction with a remote CPU that shares a portion of the processing.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A computer-automated method for locating dummy fills in an integrated circuit fabrication process, comprising:
    receiving as input layout of the integrated circuit, specification of device matching for the integrated circuit, and a maximum allowable capacitance increase;
    locating the dummy fills in the integrated circuit according to dummy rules while preserving device matching;
    designating at least one net of the integrated circuit as a critical net, the at least one critical net comprising only a subset of all nets of the integrated circuit;
    identifying metal conductors corresponding to each designated critical net from the layout file;
    determining a minimum net blocking distance that limits the maximum capacitance increase to the set maximum allowable capacitance increase; and
    for each metal conductor identified, delineating a net blocking exclusion zone extending a distance of the minimum net blocking distance from the metal conductor,
    wherein the step of locating the dummy fills includes locating the dummy fills outside of the net blocking exclusion zone.

2. The method of claim 1, wherein said determining the minimum net blocking distance comprises utilizing capacitance simulation software.

3. The method of claim 2, wherein said capacitance simulation software is one of PASCAL™ and RAPHAEL™.

4. The method of claim 1, wherein said determining the minimum net blocking distance comprises evaluating only the at least one designated critical net.

5. The system of claim 1, wherein the maximum capacitance increase input is a capacitance increase level that ensures functionality of the integrate circuit.

6. A system for locating dummy fills in an integrated circuit fabrication process, comprising:
    an input for receiving data that includes layout of the integrated circuit, specification of device matching for the integrated circuit, a maximum capacitance increase, and designation of at least one net of the integrated circuit as a designated critical net, the at least one critical net comprising only a subset of and less than all nets of the integrated circuit;
    a dummy fill locator that locates the dummy fills in the integrated circuit according to dummy rules while preserving device matching and that locates the dummy fills outside of the net blocking exclusion zone according to dummy rules;
    a metal conductor identification processor for identifying metal conductors corresponding to each designated critical net from the layout file;
    an exclusion zone processor for delineating a net blocking exclusion zone extending a distance of a minimum net blocking distance from the metal conductor for each metal conductor identified; and
    a minimum net blocking distance processor for determining the minimum net blocking distance, the minimum net blocking distance being a distance that limits the maximum capacitance increase to the received maximum capacitance.

7. The system of claim 6, wherein the maximum capacitance increase input is a capacitance increase level that ensures functionality of the integrate circuit.

8. The system of claim 6, wherein said minimum net blocking distance processor comprises a capacitance simulation software to determine the minimum net blocking distance.

9. The system of claim 8, wherein said capacitance simulation software is one of PASCAL™ and RAPHAEL™.

10. The system of claim 6, wherein said minimum net blocking distance processor evaluates only the at least one designated critical net.

11. A computer-automated method for locating dummy fills in an integrated circuit fabrication process, comprising the steps of:
    receiving as input layout of the integrated circuit and specification of at least one axis of symmetry along which the integrated circuit has device matching; and
    locating the dummy fills in the integrated circuit according to dummy rules while preserving device matching.

12. The method of claim 1, wherein said step of locating the dummy fills comprises:
    locating the dummy fills along the at least one axis of symmetry.

13. The method of claim 1, further comprising the steps of:
    designating at least one net of the integrated circuit as a critical net, the at least one critical net comprising only a subset of all nets of the integrated circuit;
    identifying metal conductors corresponding to each designated critical net from the layout file; and
    for each metal conductor identified, delineating a net blocking exclusion zone extending a distance of a minimum net blocking distance from the metal conductor, wherein the step of locating the dummy fills includes locating the dummy fills outside of the net blocking exclusion zone.

14. The method of claim 13, further comprising the step of receiving critical net input for the at least one critical net to be designated, said receiving input being one of from a user and from output of a CAD tool.

15. The method of claim 13, further comprising receiving the minimum net blocking distance as an input from one of a user and output of a software program.

16. The method of claim 13, further comprising setting the minimum net blocking distance.

17. The method of claim 13, further comprising:
receiving a maximum allowable capacitance increase; and
determining the minimum net blocking distance that limits the maximum capacitance increase to the set maximum allowable capacitance increase.

18. The method of claim 17, wherein said determining the minimum net blocking distance comprises utilizing capacitance simulation software.

19. The method of claim 18, wherein said capacitance simulation software is one of PASCAL™ and RAPHAEL™.

20. The method of claim 17, wherein said determining the minimum net blocking distance comprises evaluating only the at least one designated critical net.

21. The method of claim 13, wherein said identifying comprises identifying all metal conductors corresponding to the at least one designated critical net.

22. The method of claim 13, wherein said identifying comprises one of net tracing and tagging using the layout file.

23. The method of claim 22, wherein said identifying comprises net tracing where the layout file is in GDS-II format and said identifying comprises tagging where the layout file contains net connectivity information.

24. The method of claim 22, wherein when the layout file contains net connectivity information, the layout file is in one of annotated GDS-II format and LEF/DEF format.

25. The method of claim 13, wherein said net blocking exclusion zone includes at least a blocked zone in a designated signal net layer containing the corresponding metal conductor and in any other layers that are within a distance of the minimum net blocking distance from the corresponding metal conductor.

26. The method of claim 13, wherein said locating the dummy fills comprises utilizing at least one of a model-based dummy filling process and a rule-based dummy filling process.

27. A system for locating dummy fills in an integrated circuit fabrication process, comprising:
an input for receiving data that includes layout of the integrated circuit and specification of at least one axis of symmetry along which the integrated circuit has device matching; and
a dummy fill locator that locates the dummy fills in the integrated circuit according to dummy rules while preserving device matching.

28. The system of claim 27, wherein said dummy fill locator preserves device matching by locating the dummy fills along the at least one axis of symmetry according to dummy rules.

29. The system of claim 27, wherein the input data also designates at least one net of the integrated circuit as a designated critical net, the at least one critical net comprising only a subset of and less than all nets of the integrated circuit, further comprising:
a metal conductor identification processor for identifying metal conductors corresponding to each designated critical net from the layout file; and
an exclusion zone processor for delineating a net blocking exclusion zone extending a distance of a minimum net blocking distance from the metal conductor for each metal conductor identified,
wherein the dummy fill locator also locates the dummy fills outside of the net blocking exclusion zone according to dummy rules.

30. The system of claim 29, wherein the critical net input is from one of a user and output of a CAD tool.

31. The system of claim 29, wherein the input additionally receives the minimum net blocking distance as input.

32. The system of claim 29, wherein the input additionally receives a maximum capacitance increase as input, the system further comprising:
a minimum net blocking distance processor for determining the minimum net blocking distance, the minimum net blocking distance being a distance that limits the maximum capacitance increase to the received maximum capacitance.

33. The system of claim 32, wherein the maximum capacitance increase input is a capacitance increase level that ensures functionality of the integrate circuit.

34. The system of claim 32, wherein said minimum net blocking distance processor comprises a capacitance simulation software to determine the minimum net blocking distance.

35. The system of claim 34, wherein said capacitance simulation software is one of PASCAL™ and RAPHAEL™.

36. The system of claim 32, wherein said minimum net blocking distance processor evaluates only the at least one designated critical net.

37. The system of claim 29, wherein said metal conductor identification processor identifies all metal conductors corresponding to the at least one designated critical net.

38. The system of claim 29, wherein said metal conductor identification processor performs at least one of net tracing and tagging using the layout file.

39. The system of claim 38, wherein said metal conductor identification processor performs net tracing where the layout file is in GDS-II format and said metal conductor identification processor performs tagging where the layout file is in one of annotated GDS-II format and LEF/DEF format.

40. The system of claim 29, wherein said exclusion zone processor delineates the net blocking exclusion zone to include at least a blocked zone in a designated signal net layer containing the corresponding metal conductor and in any other layers that are within a distance of the minimum net blocking distance from the corresponding metal conductor.

41. The system of claim 29, wherein said dummy fill locator utilizes at least one of a model-based dummy fill locator and a rule-based dummy fill locator.

* * * * *